(12) United States Patent
Tanamoto et al.

(10) Patent No.: US 8,610,196 B2
(45) Date of Patent: Dec. 17, 2013

(54) MEMORY INCLUDING TRANSISTORS WITH DOUBLE FLOATING GATE STRUCTURES

(75) Inventors: Tetsufumi Tanamoto, Kawasaki (JP); Kosuke Tatsumura, Kawasaki (JP); Kiwamu Sakuma, Yokohama (JP); Atsuhiro Kinoshita, Kamakura (JP); Shinobu Fujita, Tokyo (JP); Koichi Muraoka, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/608,436

(22) Filed: Sep. 10, 2012

(65) Prior Publication Data

US 2013/0069134 A1 Mar. 21, 2013

(30) Foreign Application Priority Data

Sep. 15, 2011 (JP) ................. 2011-201867

(51) Int. Cl.
*H01L 27/11* (2006.01)
(52) U.S. Cl.
USPC .......................... 257/315; 257/903
(58) Field of Classification Search
USPC ............. 257/314–324, 903, E27.099
See application file for complete search history.

(56) References Cited

U.S. PATENT DOCUMENTS

| | | | |
|---|---|---|---|
| 7,759,724 B2 * | 7/2010 | Forbes ........................ | 257/315 |
| 2012/0074467 A1 * | 3/2012 | Abe ............................. | 257/208 |

OTHER PUBLICATIONS

S. Tanakamaru et al., "A. 0.5V Operation, 32% Lower Active, 42% Lower Leakage Current, Ferroelectric 6T-SRAM with $V_{TH}$ Self-Adjusting Function for 60% Larger Static Noise Margin", IEDM09, pp. 283-286 (2009).
S. Tanakamaru et al., "A 0.5-V Six-Transistor Static Random Access Memory with Ferroelectric-Gate Field Effect Transistors", Japanese Journal of Applied Physics 49,121501, pp. 1-8 (2010).
K. Schuegraf et al., "Hole Injection $SiO_2$ Breakdown Model for Very Low Voltage Lifetime Extrapolation", IEEE Transactions on Electron Devices, vol. 41, No. 5, pp. 761-767 (1994).
K. Tatsumura et al., Novel $V_{TH}$ Self-Adjusting MISFET with SiN Charge Trap Layer for Ultra Low Power LSI, IEDM Technical Digest, pp. 71-74 (2011).
T. Tanamoto et al., "Numerical approach for retention characteristics of double floating-gate memories", Applied Physics Letters 96, 022105 pp. 1-3 (2010).

* cited by examiner

*Primary Examiner* — Cuong Q Nguyen
(74) *Attorney, Agent, or Firm* — Finnegan, Henderson, Farabow, Garrett & Dunner, L.L.P.

(57) ABSTRACT

In a memory of an embodiment, first and second P-channel transistors are formed on a first semiconductor region, and each of the first and second P-channel transistors has a structure formed by stacking a first insulating film, a first floating gate, a second insulating film, a second floating gate, a third insulating film, and a first control gate in this order on the first semiconductor region. In the memory, first and second N-channel transistors are formed on a second semiconductor region, and each of the first and second N-channel transistors has a structure formed by stacking a fourth insulating film, a third floating gate, a fifth insulating film, a fourth floating gate, a sixth insulating film, and a second control gate in this order on the second semiconductor region.

7 Claims, 17 Drawing Sheets

$C_B = 7.76954979\,[aF]$
$C_D = 1.03593997\,[aF]$
$\alpha = 13.3\%$ $C_B = 7.76954979$ [aF]
$C_D = 2.58984993$ [aF]
$\alpha = 33.3\%$ (a)    (b)

US 8,610,196 B2

MEMORY INCLUDING TRANSISTORS WITH DOUBLE FLOATING GATE STRUCTURES

CROSS-REFERENCE TO RELATED APPLICATION

This application is based upon and claims the benefit of priority from prior Japanese Patent Application No. 2011-201867 filed on Sep. 15, 2011 in Japan, the entire contents of which are incorporated herein by reference.

FIELD

Embodiments described herein relate generally to a memory including transistors with double floating gate structures.

BACKGROUND

SRAM (Static Random Access Memory) is one of high-speed volatile memories, and is often used in large-scale integrated circuits for today's computers. Each one SRAM is basically formed with six transistors, and can perform higher-speed operations with smaller areas in association with miniaturization of transistors. However, miniaturization of transistors is becoming more and more difficult today. As a result, noise margins are becoming smaller due to device-to-device variations of transistors, and operations are becoming unstable.

To counter this problem, there have been SRAMs in which gate oxide films are replaced with films made of another material, the polarity of the material varies with the magnitude of the gate voltage so that the threshold voltage of transistors varies. In such a SRAM, ferroelectric field effect transistors (hereinafter also referred to as FeFETs) are used as the six transistors, to successfully increase the threshold voltage of each transistor and widen the noise margin of the SRAM by 60% or more. Characteristically, the substrates of the NMOS transistors and the PMOS transistors are connected to a source voltage $V_{DD}$ and a ground voltage $V_{SS}$, respectively, though it is the other way around in conventional cases. Through the connections, the polarization in the ferroelectric material can have the opposite charge configuration of that of the gate voltage. This is the principal reason for the higher threshold voltages.

In a SRAM including the above described FeFETs, a material that is not used in conventional CMOS manufacturing processes is used as the ferroelectric material. Examples of ferroelectric materials that can be used for the FeFETs include lead zirconate titanate (hereinafter also referred to as PZT), strontium bismuth tantalate (hereinafter also referred to as SBT), and bismuth lanthanum titanate (hereinafter also referred to as BLT). Expressed as $Pb(Zr, Ti)O_3$, PZT contains harmful lead (Pb), and therefore, cannot comply with environmental regulations. Also, SBT is expressed as $SrBi_2Ta_2O_9$, and needs to be crystallized at a high temperature of 700° C. or higher to achieve ferroelectricity. It is difficult to grow a thin film in an a-axis direction having spontaneous polarization. Furthermore, the residual polarization is 25 $\mu C/cm^2$, which is relatively small. BLT is expressed as $(Bi, Ln)_4Ti_3O_{12}$, and it is difficult to crystallize BLT by controlling orientations. It should be noted that Ln represents La, Nd, Pr, or the like. Therefore, it is difficult to use ferroelectric materials in today's industries, due to small residual polarization and high coercive fields or the like.

DETAILED DESCRIPTION

A memory according to an embodiment includes: at least one SRAM cell including: a first inverter including a first P-channel transistor and a first N-channel transistor; a second inverter including a second P-channel transistor and a second N-channel transistor, the second inverter being cross-coupled to the first inverter; a third N-channel transistor including source/drain and a gate, one of the source/drain of the third N-channel transistor being connected to an output node of the first inverter, the other one of the source/drain being connected to a first interconnect, the gate of the third N-channel transistor being connected to a second interconnect; and a fourth N-channel transistor including source/drain and a gate, one of the source/drain of the fourth N-channel transistor being connected to an output node of the second inverter, the other one of the source/drain being connected to a third interconnect, the gate of the fourth N-channel transistor being connected to the second interconnect, each of the first and second P-channel transistors being formed on a first semiconductor region and including: a first insulating film formed on the first semiconductor region; a first floating gate formed on the first insulating film; a second insulating film formed on the first floating gate; a second floating gate formed on the second insulating film; a third insulating film formed on the second floating gate; and a first control gate formed on the third insulating film, each of the first and second N-channel transistors being formed on a second semiconductor region and including: a fourth insulating film formed on the second semiconductor region; a third floating gate formed on the fourth insulating film; a fifth insulating film formed on the third floating gate; a fourth floating gate formed on the fifth insulating film; a sixth insulating film formed on the fourth floating gate; and a second control gate formed on the sixth insulating film.

The following is a description of embodiments, with reference to the accompanying drawings.

Figure 1:
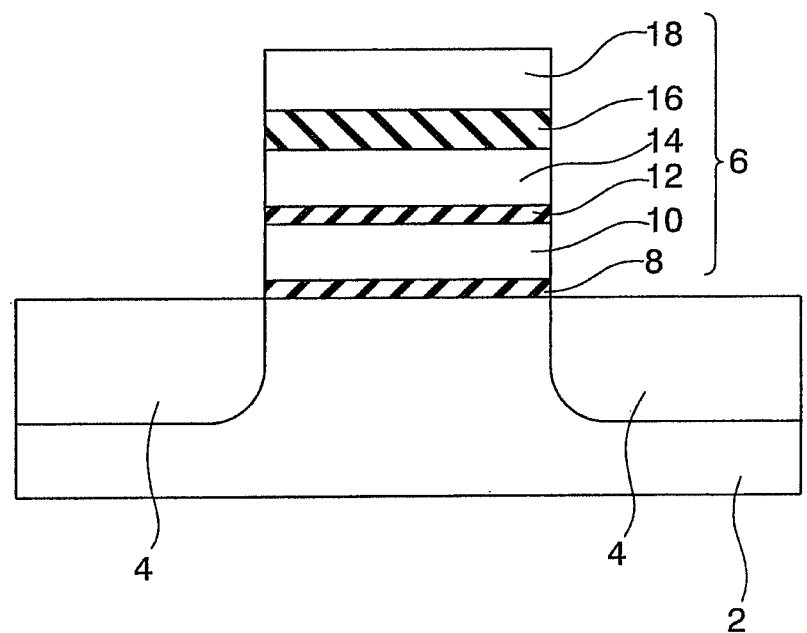
FIG. 1 is a cross-sectional view of a transistor having a double floating gate structure according to an embodiment.
Figure 2:
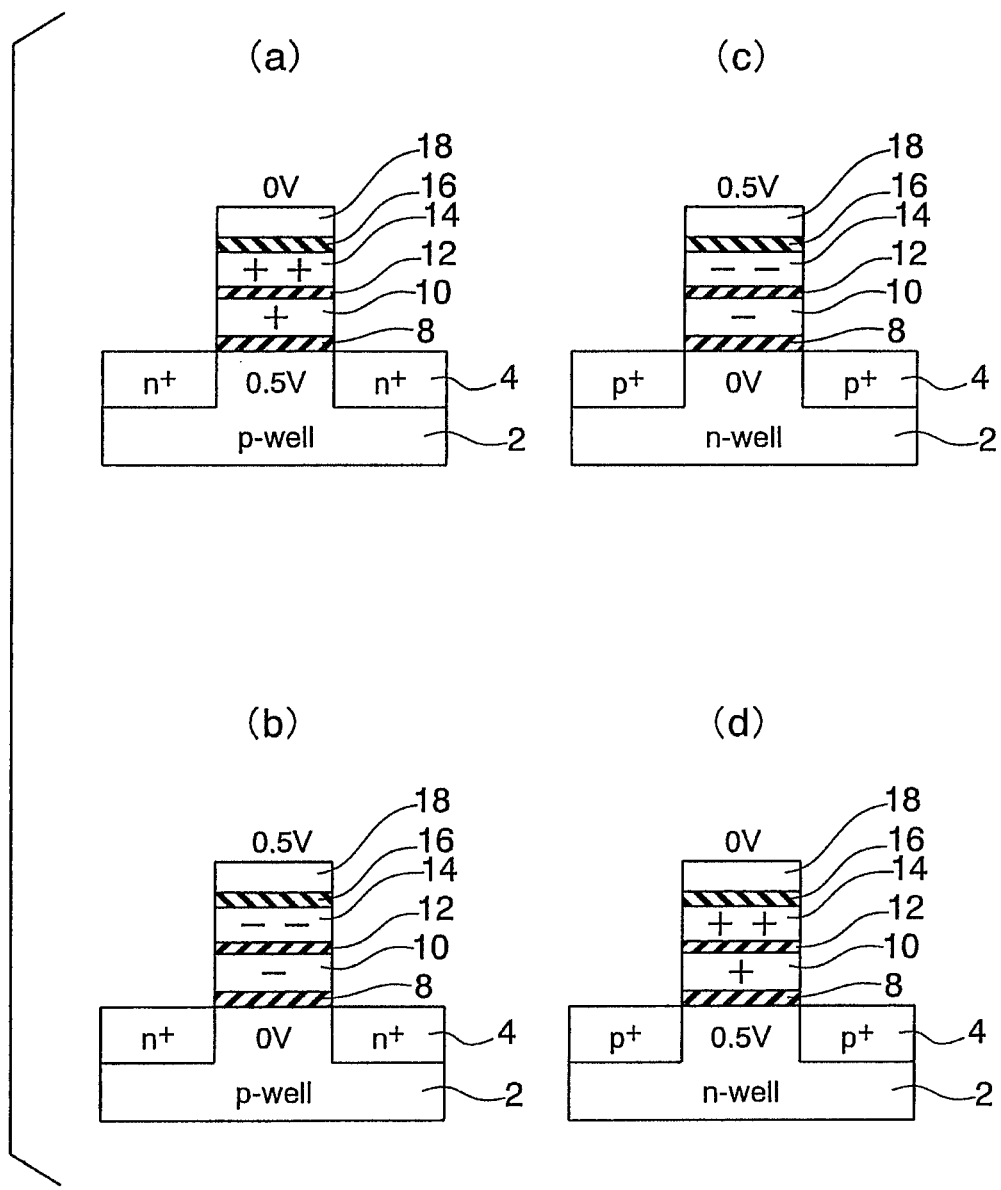
FIGS. 2(a) through 2(d) are diagrams for explaining the relationships between the voltages applied to the control gates of transistors having double floating gate structures and the charges stored in the second floating gates.

Referring to FIGS. 1 through 4, a memory according to an embodiment is described. The memory of this embodiment is a SRAM having six transistors, and the transistors forming cross-coupled inverters have double floating gate (DFG) structures. FIG. 1 is a cross-sectional view of a transistor having a double floating gate structure. This transistor 1 includes: a source and drain (hereinafter also referred to as "source/drain") 4 that are formed at a distance from each other in a semiconductor region 2 and have a different conductivity type from that of the semiconductor region 2; and a gate structure 6 formed on the portion (the channel) of the semiconductor region 2 located between the source and the drain. It should be noted that, in this specification, a semiconductor region means a semiconductor substrate, a well region, a SOI (Silicon On Insulator) layer, or the like. This gate structure 6 has a structure formed by stacking a first insulating film 8, a first floating gate 10, a second insulating film 12, a second floating gate 14, an interelectrode insulating film 16, and a control gate 18 in this order. The first and second floating gates 10 and 14 are made of polysilicon, for example. The first and second insulating films are silicon oxide films or high-permittivity (high-k) films (or high dielectric-constant films), and the interelectrode insulating film 16 is formed with a silicon oxide film thicker than the first and second insulating films, or a silicon nitride film. A high-permittivity material is a material with higher permittivity than that of a silicon oxide. Examples of such high-permittivity materials include SiN, SiON, AlO, AlON, HfO, HfON, ZrO, and ZrON.

As described above, a transistor having a double floating gate structure is a semiconductor element having the two floating gates 10 and 14 that are charge storage layers made of polysilicon or the like and sandwich the second insulating film 12. Cells of NAND flash memories that are widely used in today's society are elements each having a one-layer floating gate that is a charge storage layer. It is known that, in a transistor having a double floating gate structure, the double gloating gate structure behaves as an artificial dipole (as disclosed by T. Tanamoto and K. Muraoka in Appl. Phys. Lett. 96, 022105 (2010), for example). In a double floating gate structure, the opposite charges from the voltage applied to the control gate 18 tend to gather in the second floating gate 14, which is located close to the control gate 18. For example, as shown in FIG. 2(a), in a NMOS transistor, when a voltage of 0 V with reference to the semiconductor region (substrate) 2 is applied to the control gate 18, positive charges gather in the first and second floating gates 10 and 14. However, the amount of positive charges gathering in the second floating gate 14 is larger than the amount of positive charges gathering in the first floating gate 10. In such a NMOS transistor, when a voltage of 0.5 V with reference to the semiconductor region 2 is applied to the control gate 18, negative charges gather in the first and second floating gates 10 and 14. However, the amount of negative charges gathering in the second floating gate 14 is larger than the amount of negative charges gathering in the first floating gate 10 (FIG. 2(b)). In a PMOS transistor, when a voltage of 0.5 V with reference to the semiconductor region 2 is applied to the control gate 18, negative charges gather in the first and second floating gates 10 and 14. However, the amount of negative charges gathering in the second floating gate 14 is larger than the amount of negative charges gathering in the first floating gate 10 (FIG. 2(c)). In such a PMOS transistor, when a voltage of 0 V with reference to the semiconductor region 2 is applied to the control gate 18, positive charges gather in the first and second floating gates 10 and 14. However, the amount of positive charges gathering in the second floating gate 14 is larger than the amount of positive charges gathering in the first floating gate 10 (FIG. 2(d)).

In transistors having double floating gate structures as in this embodiment, the double floating gate structures function in place of the dipoles in the dielectric materials of FeFETs. Where double floating gate structures are used, there is no need to use a ferroelectric material such as $SrBi_2Ta_2O_9$, and a conventional mask for forming a gate can be used to form a floating gate.

Figure 3:
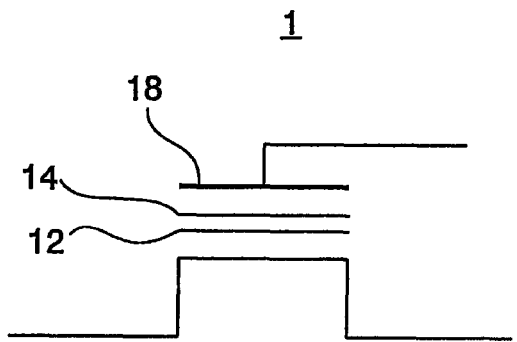
FIG. 3 is a diagram symbolically showing a transistor having a double floating gate structure.

In this specification, the transistor 1 having such a double floating gate structure is expressed as shown in FIG. 3.

Figure 4:
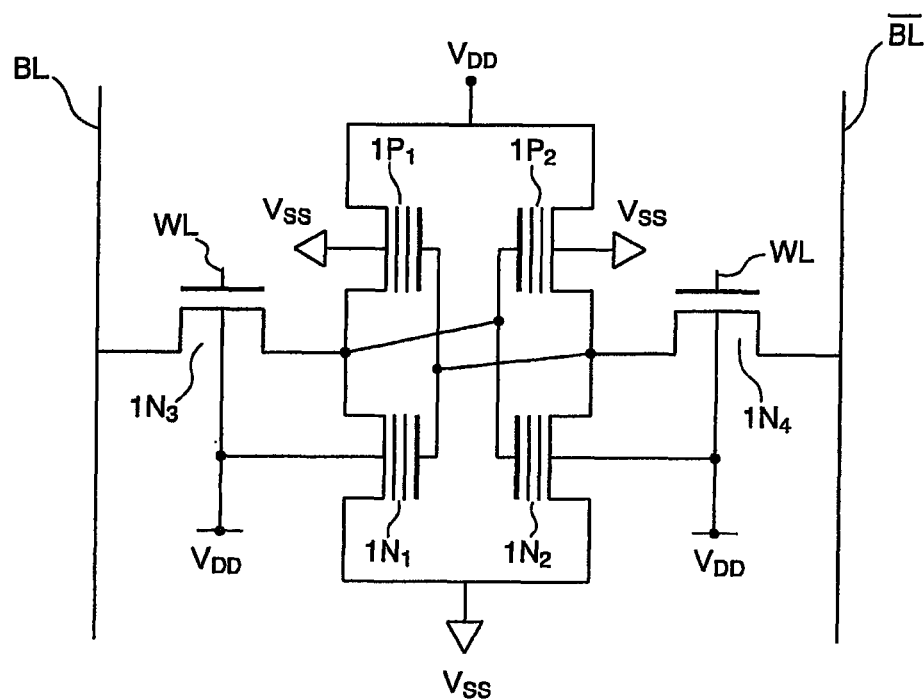
FIG. 4 is a circuit diagram showing an example SRAM cell according to an embodiment.

FIG. 4 is a circuit diagram of a SRAM according to this embodiment. The SRAM of this embodiment includes P-channel transistors $1P_1$ and $1P_2$, N-channel transistors $1N_1$ and $1N_2$, and N-channel transistors $1N_3$ and $1N_4$. The P-channel transistor $1P_1$ and the N-channel transistor $1N_1$ form a first inverter, and the P-channel transistor $1P_2$ and the N-channel transistor $1N_2$ form a second inverter. The first and second inverters have input terminals and output terminals cross-coupled. Specifically, the input terminal of the first inverter is connected to the output terminal of the second inverter, and the output terminal of the first inverter is connected to the input terminal of the second inverter. The first and second inverters form the latch unit of the SRAM. The P-channel transistors $1P_1$ and $1P_2$ serve as pull-up transistors, and the N-channel transistors $1N_1$ and $1N_2$ serve as pull-down transistors. The P-channel transistors $1P_1$ and $1P_2$, and the N-channel transistors $1N_1$ and $1N_2$ are the transistors having double floating gate structures.

Meanwhile, the N-channel transistors $1N_3$ and $1N_4$ serve as access transistors. Specifically, the transistor $1N_3$ has one of the source/drain connected to the output terminal of the first inverter, has the other one of the source/drain connected to a first bit line BL, and has a gate connected to a word line WL. The transistor $1N_4$ has one of the source/drain connected to the output terminal of the second inverter, has the other one of the source/drain connected to a second bit line/BL, and has a gate connected to the word line WL.

The P-channel transistors $1P_1$ and $1P_2$ are connected to a ground voltage $V_{SS}$ as a substrate bias, and the N-channel transistors $1N_1$, $1N_2$, $1N_3$, and $1N_4$ are connected to a source voltage $V_{DD}$ as a substrate bias.

The SRAM of this embodiment having the above described structure is capable of performing the same writing and reading operations as those performed by a SRAM formed with six transistors.

Figure 5:
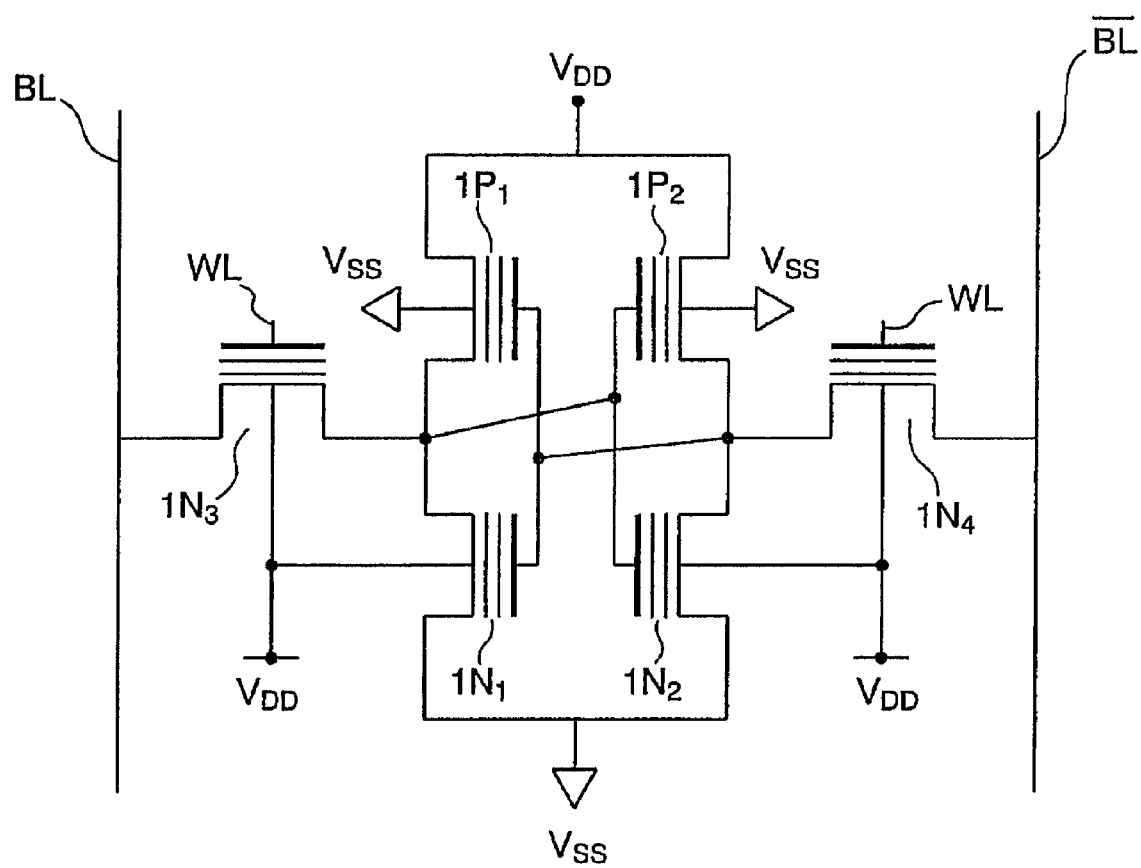
FIG. 5 is a circuit diagram showing another example of SRAM cell according to an embodiment.

As in a modification of this embodiment shown in FIG. 5, the access transistors $1N_3$ and $1N_4$ can also be transistors having double floating gate structures.

In the above description, each SRAM is formed with six transistors in this embodiment and the modification thereof. However, each SRAM can be formed with more than six transistors, to stabilize operations of each SRAM.

Next, the results of more detailed studies made by the inventors on the SRAM of this embodiment are described.

Of the six transistors arranged in the SRAM, two transistors $1N_3$ and $1N_4$ serve as access transistors, and the other four transistors $1P_1$, $1P_2$, $1N_1$, and $1N_2$ are cross-coupled. As for the arrangement of the four transistors $1P_1$, $1P_2$, $1N_1$, and $1N_2$ cross-coupled in the SRAM, the four transistors $1P_1$, $1P_2$, $1N_1$, and $1N_2$ can be arranged symmetrically about the center point of the SRAM. This is a point-symmetric arrangement. The four transistors $1P_1$, $1P_2$, $1N_1$, and $1N_2$ can be arranged symmetrically about the center line of the SRAM cell. This is an axisymmetric arrangement. Specifically, in the point-symmetric arrangement, the transistor $1P_1$ and the transistor $1N_1$ are arranged symmetrically about the center point of the SRAM cell, and the transistor $1P_2$ and the transistor $1N_2$ are arranged symmetrically about the center point of the SRAM cell. In the axisymmetric arrangement, the transistor $1P_1$ and the transistor $1N_1$ are arranged symmetrically about the center line of the SRAM cell, and the transistor $1P_2$ and the transistor $1N_2$ are arranged symmetrically about the center line of the SRAM cell.

Figure 6:
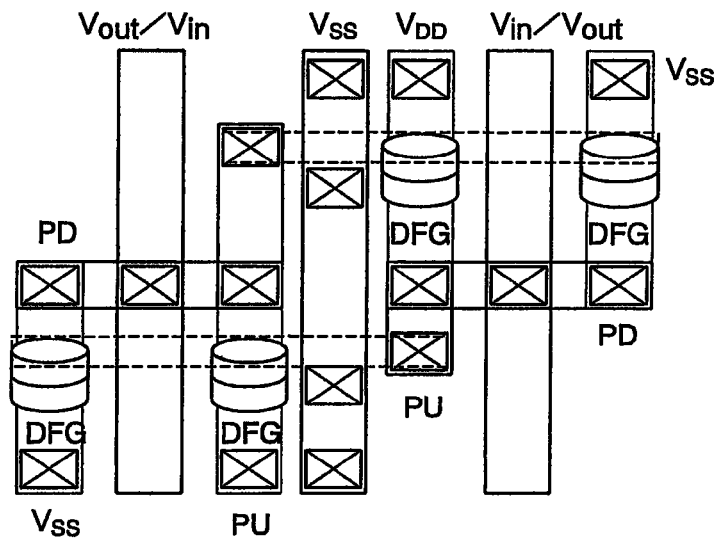
FIG. 6 is a layout chart showing a point-symmetric arrangement in a SRAM cell according to an embodiment.
Figure 7:
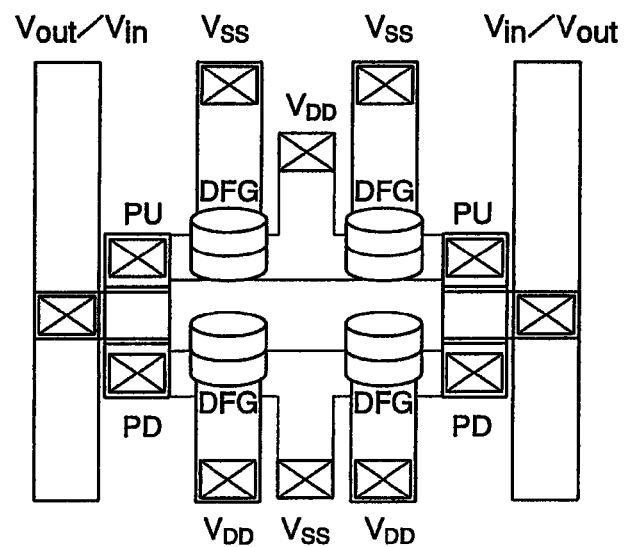
FIG. 7 is a layout chart showing an axisymmetric arrangement in a SRAM cell according to an embodiment.

FIG. 6 shows the latch unit of a SRAM of the point-symmetric arrangement type. FIG. 7 shows the latch unit of a SRAM of the axisymmetric arrangement. For the sake of simplicity, contact holes and some of the interconnects for gate electrodes are not shown in FIGS. 6 and 7. In FIGS. 6 and 7, PU indicate the pull-up transistors $1P_1$ and $1P_2$, and PD indicate the pull-down transistors $1N_1$ and $1N_2$. DFG indicates the double floating gate structures. $V_{DD}$ indicates high potentials in the circuits, and $V_{SS}$ indicates the potentials of the substrate.

In the following, an operation to automatically optimize the threshold voltage at which a transistor is turned on with a double floating gate structure is described through simulations based on basic models. The models and calculation methods used here are compliant with those used by T. Tanamoto and K. Muraoka in Appl. Phys. Lett. 96, 022105 (2010).

First, the relationships between the charges and the potentials in respective floating gates are determined using a capacitance network model. As shown in each of FIGS. 8(a) and 8(b), there are a total of eight floating gates. FIG. 8(a) shows a point-symmetric arrangement model, and FIG. 8(b) shows an axisymmetric arrangement model. In each of those models, the symbols N, W, S, and E, which mean directions, are assigned to the four transistors forming a latch unit. A is assigned to each second floating gate 14, and B is assigned to each first floating gate 10. For example, the pull-up transistors $1P_1$ and $1P_2$ are represented by W and S, respectively, and the pull-down transistors $1N_1$ and $1N_2$ are represented by N and E, respectively. Accordingly, the relationships between the charges $Q_{NA}$ and potential $V_{NA}$ of the second floating gate NA of the transistor $1N_1$ located in the direction N, for example, and the potentials of the other floating gates are expressed by the following equation (1):

$$Q_{NA}=C_{NAWA}(V_{NA}-V_{WA})+C_{NAEA}(V_{NA}-V_{EA})+C_{NAWg}(V_{NA}-V_{Wg})+C_{NAEg}(V_{NA}-V_{Eg})+C_{NAWB}(V_{NA}-V_{WB})+C_{NAEB}(V_{NA}-V_{EB})+C_{NANB}(V_{NA}-V_{NB})+C_{NANg}(V_{NA}-V_{Ng})+C_{NASA}(V_{NA}-V_{SA}) \quad (1)$$

Here, $C_{NAWA}$ represents the capacitance between the floating gate NA and the floating gate WA, for example, $C_{NAWg}$ represents the capacitance between the floating gate NA and the gate in the direction W, for example, and $V_{Ng}$, $V_{Wg}$, $V_{Sg}$, and $V_{Eg}$ represent the gate voltages of the transistors in the respective directions. Likewise, the charges $Q_{NB}$ of the first floating gate NB of the transistor located in the direction N are expressed by the following equation (2):

$$Q_{NB}=C_{NBWB}(V_{NB}-V_{WB})+C_{NBEB}(V_{NB}-V_{EB})+C_{NBWsub}(V_{NB}-V_{Wsub})+C_{NBEsub}(V_{NB}-V_{Esub})+C_{NBWA}(V_{NB}-V_{WA})+C_{NBEA}(V_{NA}-V_{EA})+C_{NBNA}(V_{NB}-V_{NA})+C_{NBsub}(V_{NB}-V_{Nsub})+C_{NBSB}(V_{NB}-V_{SB}) \quad (2)$$

Here, $V_{Nsub}$, $V_{Wsub}$, $V_{Ssub}$, and $V_{Esub}$ represent the substrate potentials in the respective directions. As for $(QW_A, V_{WA})$, $(Q_{WB}, V_{WB})$, $(Q_{SA}, V_{SA})$, and $(Q_{EB}, V_{EB})$, the same equation as above is satisfied. Where $S_i$ and $d_i$ represent the area and distance between floating gates, and $\in$ represents the permittivity of the tunnel film between the floating gates, each capacitance is expressed by the following equation (3) using a parallel-plate capacitance formula:

$$C_i = \in S_i/d_i \quad (3)$$

Where the current flowing between the first and second floating gates is represented by a function of an electric field E, the current density J(E) is calculated by a known method (as disclosed by K. F. Schuegraf and C. Hu, in IEEE Trans. Electron Device 41, 761 (1994), for example). The current density J(E) is expressed by the following equation (4):

$$J(E)=AE^2 \exp\{-B[1-(1-Ed_{ox}/\Phi_b)^{3/2}]/E\}$$

$$A=e^3 m_{Si}/(8\pi h m_{ox}\Phi_b)$$

$$B=4\sqrt{2m_{ox}}\Phi_b^{3/2}/(3he/(2\pi)) \quad (4)$$

Here, e represents the elementary charge amount, $m_{Si}$ represents the effective mass of silicon ($m_{Si}$=0.19), $m_{ox}$ represents the effective mass of the second insulating film 12 ($m_{ox}$=0.5), $\in_{Si}$ represents the permittivity of silicon ($\in_{Si}$=11.7), $\in_{ox}$ represents the permittivity of the second insulating film 12 made of silicon oxide ($\in_{ox}$=3.9), and $d_{ox}$ represents the thickness of the second insulating film 12. Meanwhile, $\Phi_b$ represents the height of the barrier of the second insulating film 12 made of silicon oxide, and the value of the height is 2.9 [eV]. Further, h represents the Planck's constant. In the above simulation, the threshold value is defined as a voltage such that the potential difference between the substrate (the semiconductor region 2) and the first floating gate 10 becomes zero with respect to the charge configuration at each time.

Figure 9:
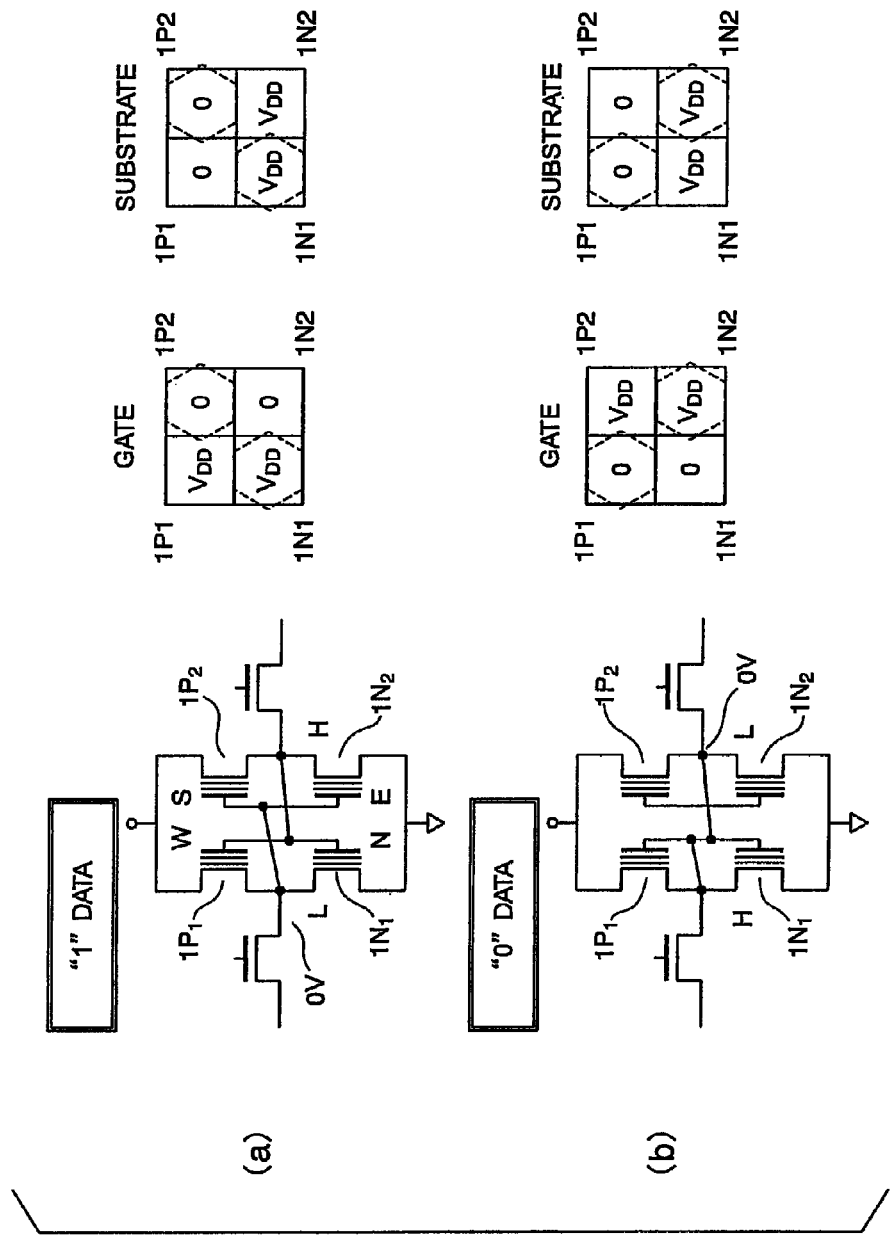
FIGS. 9(a) and 9(b) are diagrams showing the basic relationships between the gate and substrate voltages of the transistors in an axisymmetric arrangement and data stored in a SRAM cell.

FIGS. 9(a) and 9(b) show the distributions of the gate voltage and the substrate voltage in this embodiment. FIGS. 9(a) and 9(b) are diagrams showing the basic relationships between the gate and substrate voltages of the transistors in an axisymmetric arrangement and data stored in a SRAM cell. The bias on the substrate side in a transistor having a double floating gate structure of this embodiment is the opposite of the bias on the substrate side in a conventional transistor. For example, a drive voltage $V_{DD}$ is applied to the substrate-side bias in the N-channel transistors $1N_1$ and $1N_2$, and a voltage of 0 V is applied to the substrate-side bias in the P-channel transistors $1P_1$ and $1P_2$. The "0" data and the "1" data stored in the SRAM of this embodiment are defined as shown in FIGS. 9(a) and 9(b). Specifically, when the potential level of the output terminal of the second inverter formed with the transistors $1P_2$ and $1N_2$ is at "H" level, "1" data is stored (see FIG. 9(a)). When the potential level is at "L" level, "0" data is stored (see FIG. 9(b)).

Figure 10:
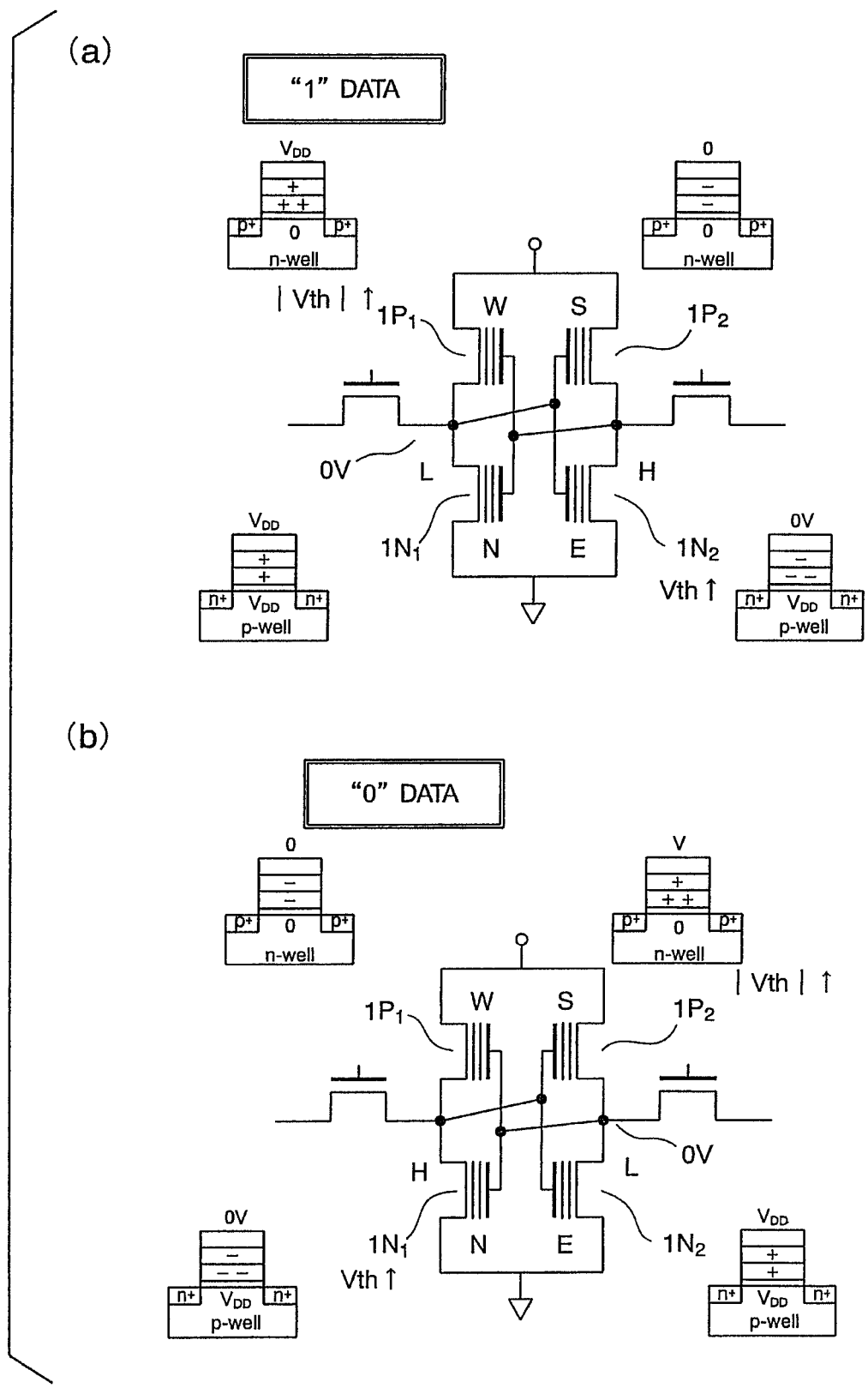
FIGS. 10(a) and 10(b) are diagrams each showing the gate voltages and the substrate voltages of the respective transistors in a point-symmetric arrangement.
Figure 11:
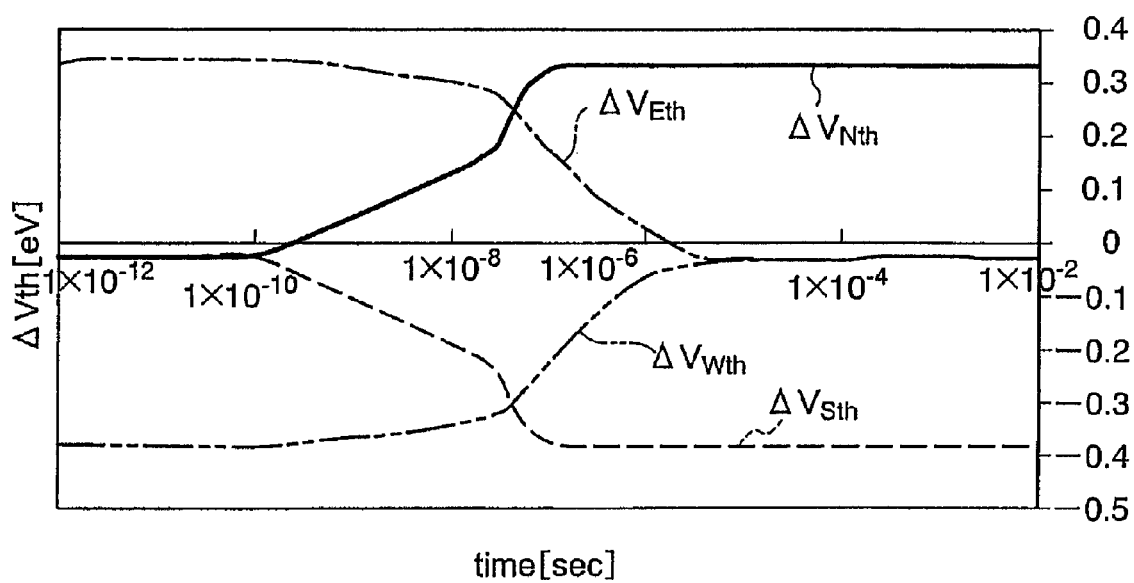
FIG. 11 is a graph showing threshold voltage variations in a SRAM cell of a point-symmetric arrangement type.
Figure 12:
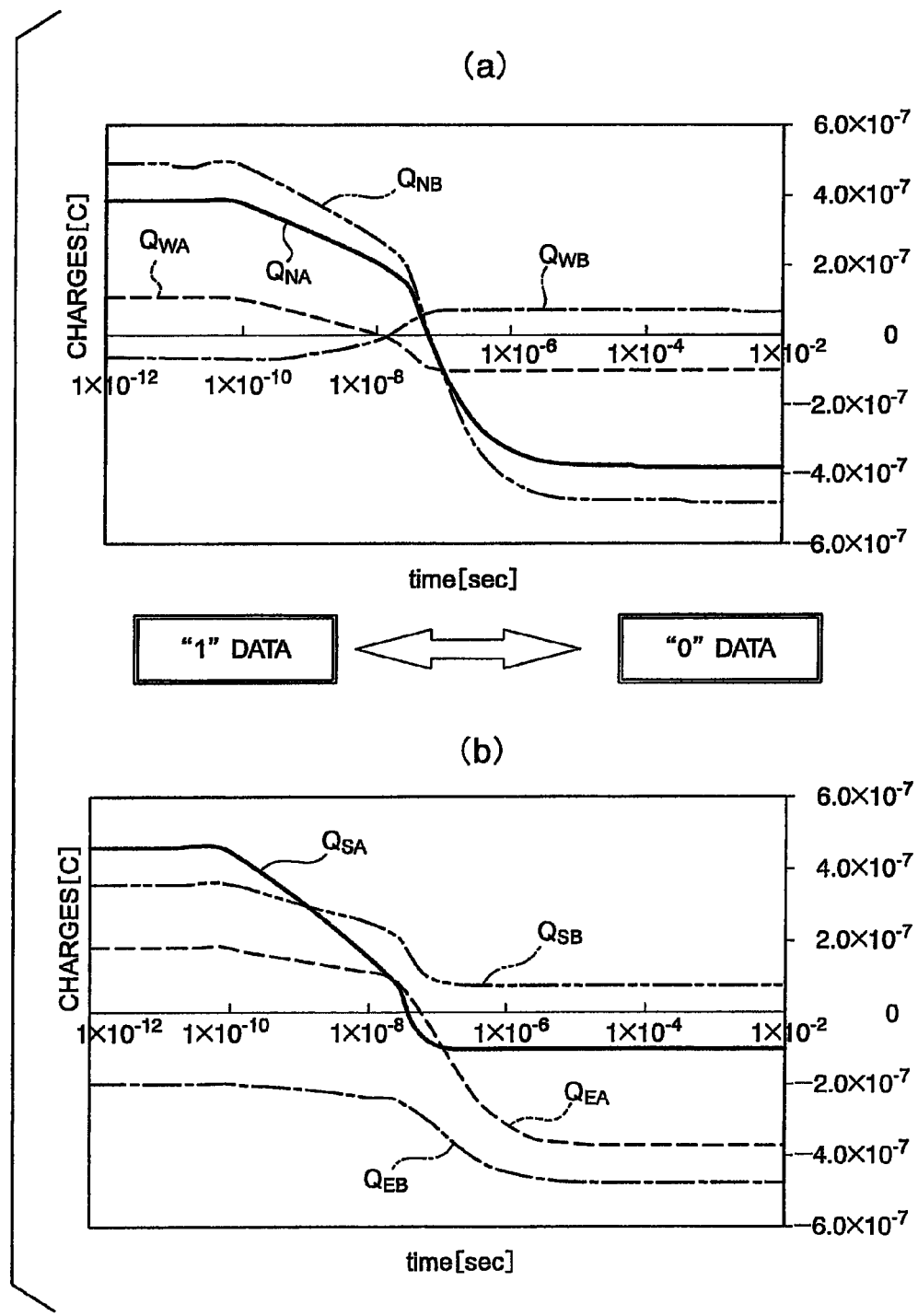
FIGS. 12(a) and 12(b) are graphs showing variations in charges stored in the respective floating gates in the SRAM cell of the point-symmetric arrangement type.

FIGS. 10(a) and 10(b) show the gate biases and the substrate biases of transistors forming a latch unit in cases where "1" data and "0" data are stored in a SRAM of a point-symmetric arrangement type. FIG. 11 shows the threshold voltage variations ΔVth caused by transitions made between the "1"-data storing state and the "0"-data storing state in the SRAM of the point-symmetric arrangement type. FIGS. 12(a) and 12(b) show the charge distribution variations caused by the transitions.

Figure 13:
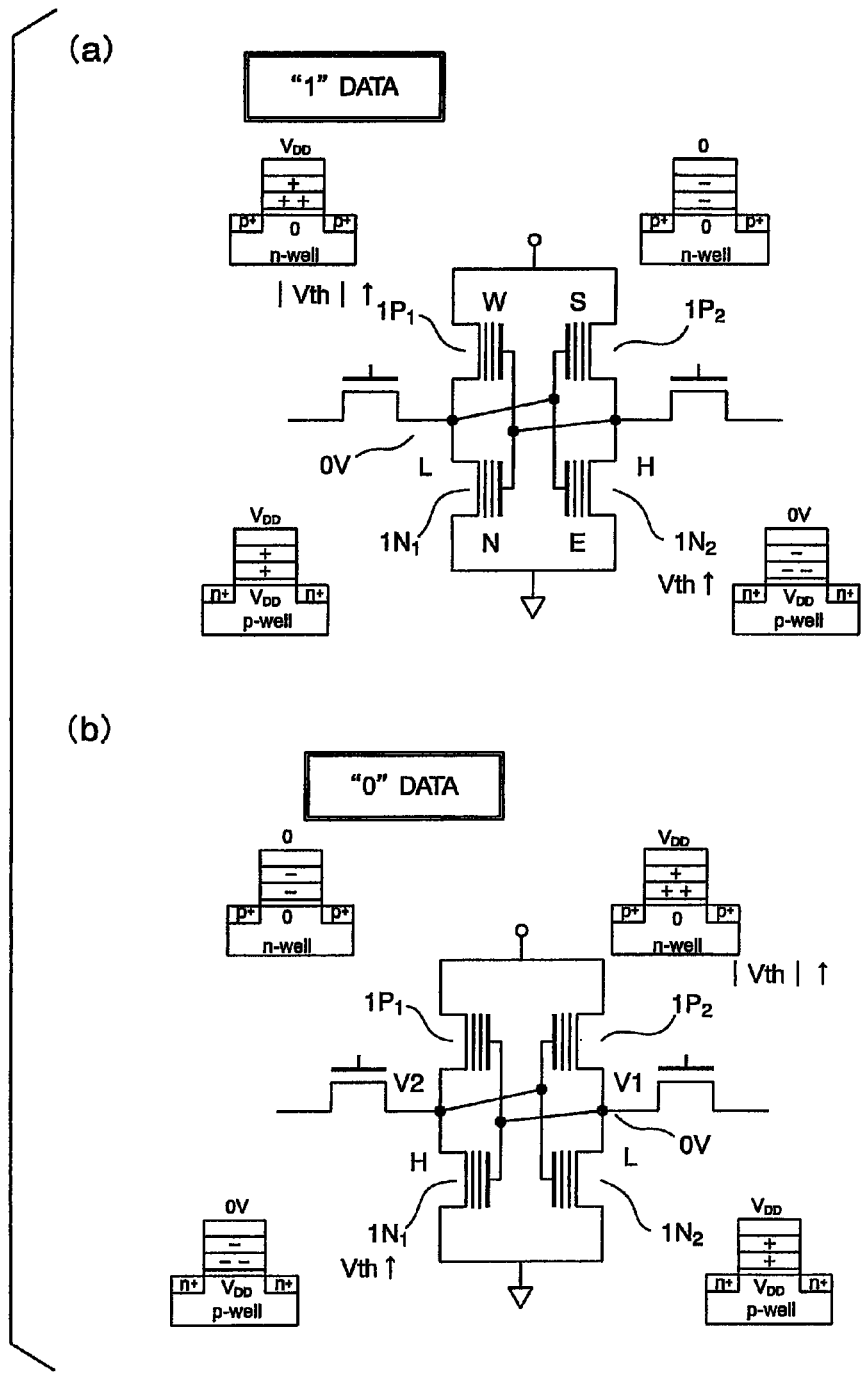
FIGS. 13(a) and 13(b) are diagrams each showing the gate voltages and the substrate voltages of the respective transistors in an axisymmetric arrangement.
Figure 14:
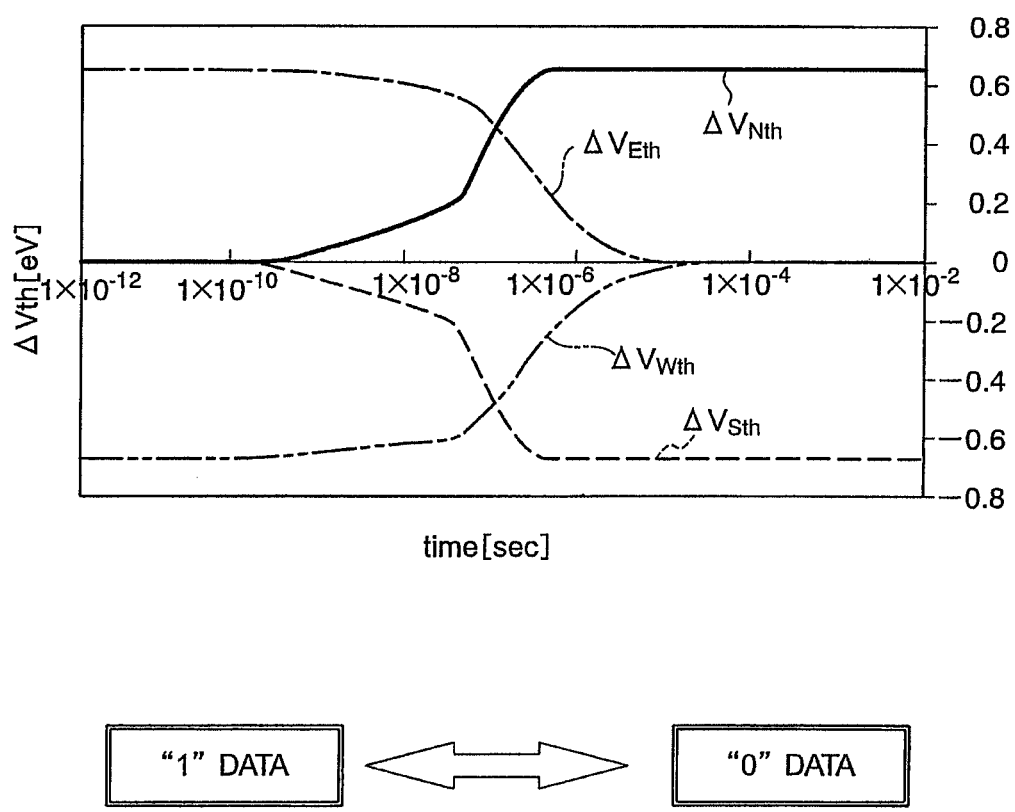
FIG. 14 is a graph showing threshold voltage variations in a SRAM cell of an axisymmetric arrangement type.
Figure 15:
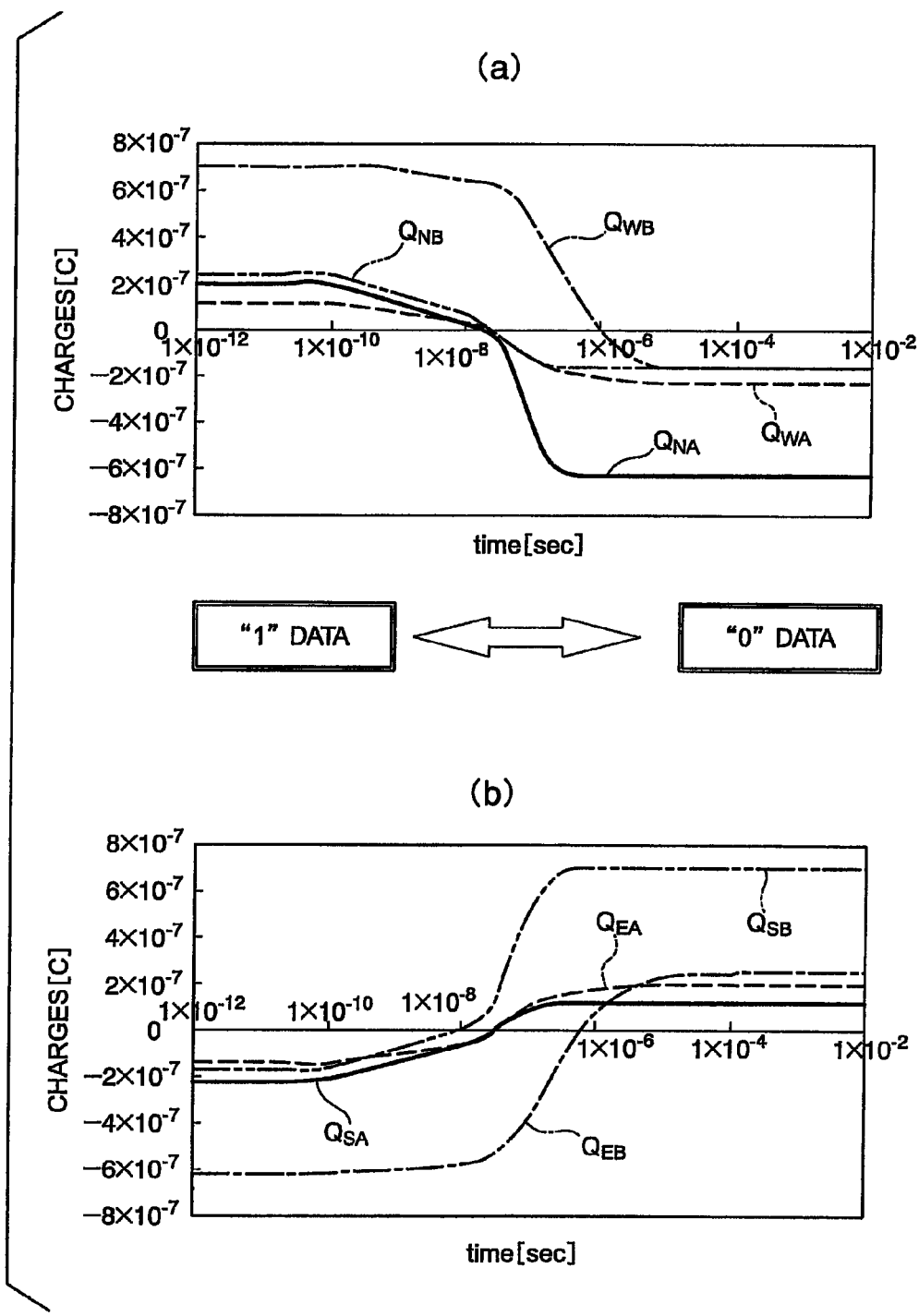
FIGS. 15(a) and 15(b) are graphs showing variations in charges stored in the respective floating gates in the SRAM cell of the axisymmetric arrangement type.

FIGS. 13(a) and 13(b) show the gate biases and the substrate biases of transistors forming a latch unit in cases where "1" data and "0" data are stored in a SRAM of an axisymmetric arrangement type. FIG. 14 shows the threshold voltage variations ΔVth caused by transitions made between the "1"-data storing state and the "0"-data storing state in the SRAM of the axisymmetric arrangement type. FIGS. 15(a) and 15(b) show the charge distribution variations caused by the transitions.

FIG. 11, FIGS. 12(a) and 12(b), FIG. 14, and FIGS. 15(a) and 15(b) show simulation results. In each of FIG. 11, FIGS. 12(a) and 12(b), FIG. 14, and FIGS. 15(a) and 15(b), the abscissa axis indicates time, and functions of the time from the "1"-data storing state to the "0"-data storing state are shown. In each of FIGS. 11 and 14, $\Delta V_{Nth}$ and $\Delta V_{Eth}$ represent the threshold voltage variations in the transistors $1N_1$ and $1N_2$, respectively, and $\Delta V_{Wth}$ and $\Delta V_{Sth}$ represent the threshold voltage variations in the transistors $1P_1$ and $1P_2$, respectively. In each of FIGS. 12(a) and 12(b) and FIGS. 15(a) and 15(b), $Q_{WA}$ and $Q_{WB}$ represent the charges stored in the second and first floating gates of the transistor $1P_1$, respectively, and $Q_{NA}$ and $Q_{NB}$ represent the charges stored in the second and first floating gates of the transistor $1N_1$, respectively. Likewise, $Q_{SA}$ and $Q_{SB}$ represent the charges stored in the second and first floating gates of the transistor $1P_2$, respectively, and $Q_{EA}$ and $Q_{EB}$ represent the charges stored in the second and first floating gates of the transistor $1N_2$, respectively.

Figure 18:
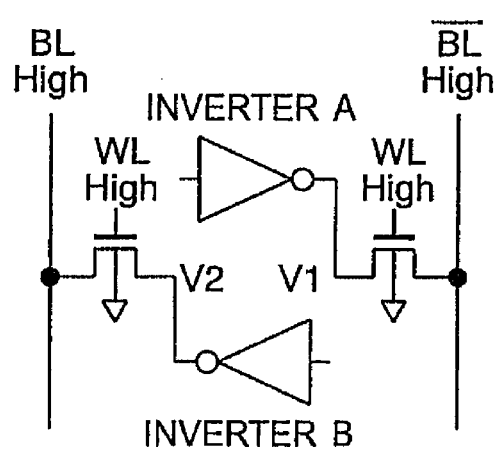
FIGS. 18(a) and 18(b) are diagrams for explaining the SNM as the noise margin index for SRAMs.
Figure 18:
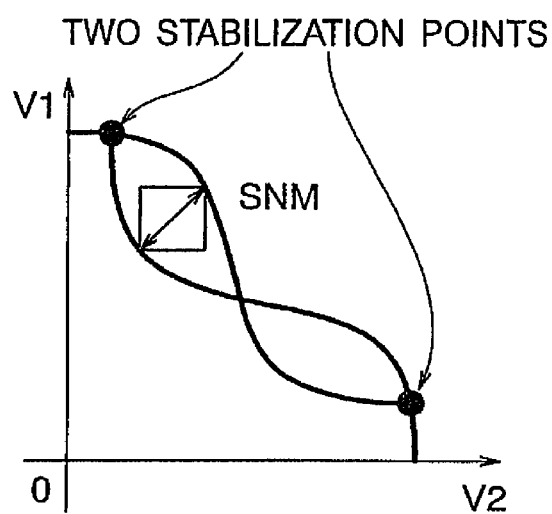

Referring now to FIGS. 18(a) and 18(b), the SNM (Static Noise Margin), which is the noise margin index for SRAMs, is described. A SRAM is characterized by the size of the area denoted by "SNM" where the SRAM is divided into two parts as shown in FIG. 18(a), and the characteristics of the two inverters are summarized as shown in FIG. 18(b). When the distance between the characteristics of the two inverters is long, the data "0" or the data "1" to be stored in the SRAM is determined, regardless of variations in transistor characteristics. The characteristic curves shown in FIG. 18(b) are normally called "butterfly-curves".

Figure 19:
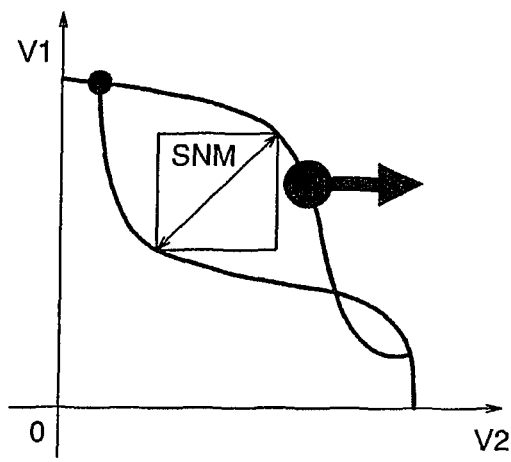
FIG. 19 shows a change in the butterfly-curves in a case where the data stored in the SRAM is "1"
Figure 20:
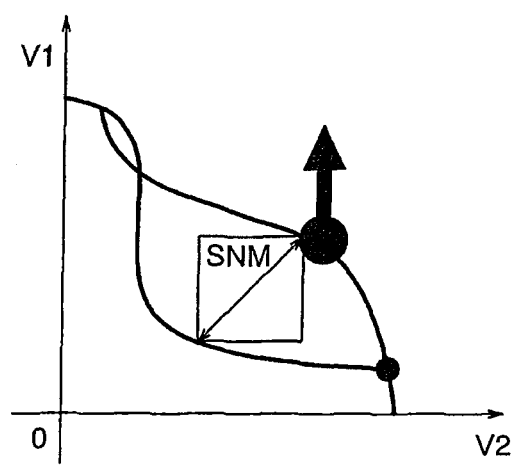
FIG. 20 shows a change in the butterfly-curves in a case where the data stored in the SRAM is "0".

As can be seen from FIGS. 11 and 14, the threshold voltage variations serve to increase the noise margins in both SRAMs of the point-symmetric arrangement type and the axisymmetric arrangement type. As shown in FIG. 10(a), for example, in the "1"-data storing state, the voltage $V_{DD}$ is applied to the gates of the transistors $1P_1$ and $1N_1$ forming the first inverter, and the channel of the NMOS transistor $1N_1$ of the first inverter opens. However, the channel of the NMOS transistor $1N_2$ of the second inverter should be closed. As can be seen from the graph in FIG. 11, the threshold voltage variation $\Delta V_{Nth}$ of the transistor $1N_1$ is almost 0, and the threshold voltage has hardly varied. The absolute value of the threshold voltage variation $\Delta V_{Wth}$ of the transistor $1P_1$ is approximately 0.4 V, and the threshold voltage has varied approximately 0.4 V. Meanwhile, the threshold voltage variation $\Delta V_{Eth}$ of the N-channel transistor $1N_2$ has increased, and a more stable OFF state is observed. In terms of noise margins, the curve of the second inverter with a V2 input and a V1 output shifts to the right as shown in FIG. 19, and the noise margin has increased. FIG. 20 shows a change in the butterfly-curves caused for the same reason as above in the case of the data "0".

The following values were used as the parameters in the above described simulations. In both the point-symmetric arrangement and the axisymmetric arrangement, the applied voltage $V_{DD}$ was 0.5 V. In the point-symmetric arrangement, the width of each of the first and second floating gates was 15 nm, the distances between the first and second floating gates and the first and second floating gates of each two adjacent transistors were 15 nm, the height of each of the first and floating gates was 25 nm, the thickness of the first insulating film between the semiconductor substrate and the first floating gate was 1 nm, the thickness of the second insulating film between the first and second floating gates was 1 nm, and the film thickness of the interelectrode insulating film between the second floating gate and the control gate was 1 nm. In the axisymmetric arrangement, the width of each of the first and second floating gates was 30 nm, the distances between the first and second floating gates and the first and second floating gates of each two adjacent transistors were 30 nm, the height of each of the first and floating gates was 50 nm, the thickness of the first insulating film between the semiconductor substrate and the first floating gate was 1 nm, the thickness of the second insulating film between the first and second floating gates was 1 nm, and the film thickness of the interelectrode insulating film between the second floating gate and the control gate was 1.2 nm.

When those parameters are changed, the calculation results also change, but the changes can be predicted. For example, when the voltage is increased, the switching rate between the "0" data and the "1" data becomes higher. When the thickness of the tunneling film between the floating gates is increased, the switching rate gradually becomes lower. When the distance between each two memory cells is made longer, the interference between the cells becomes smaller, and the threshold voltage variations gradually become smaller. As described above, by using double floating gate structures, threshold voltage shifts can be achieved so that the butterfly-curves become wider in the voltage conditions shown in FIGS. 10(a) and 10(b) and FIGS. 13(a) and 13(b) in the SRAM in the point-symmetric arrangement and the SRAM in the axisymmetric arrangement.

Figure 8:
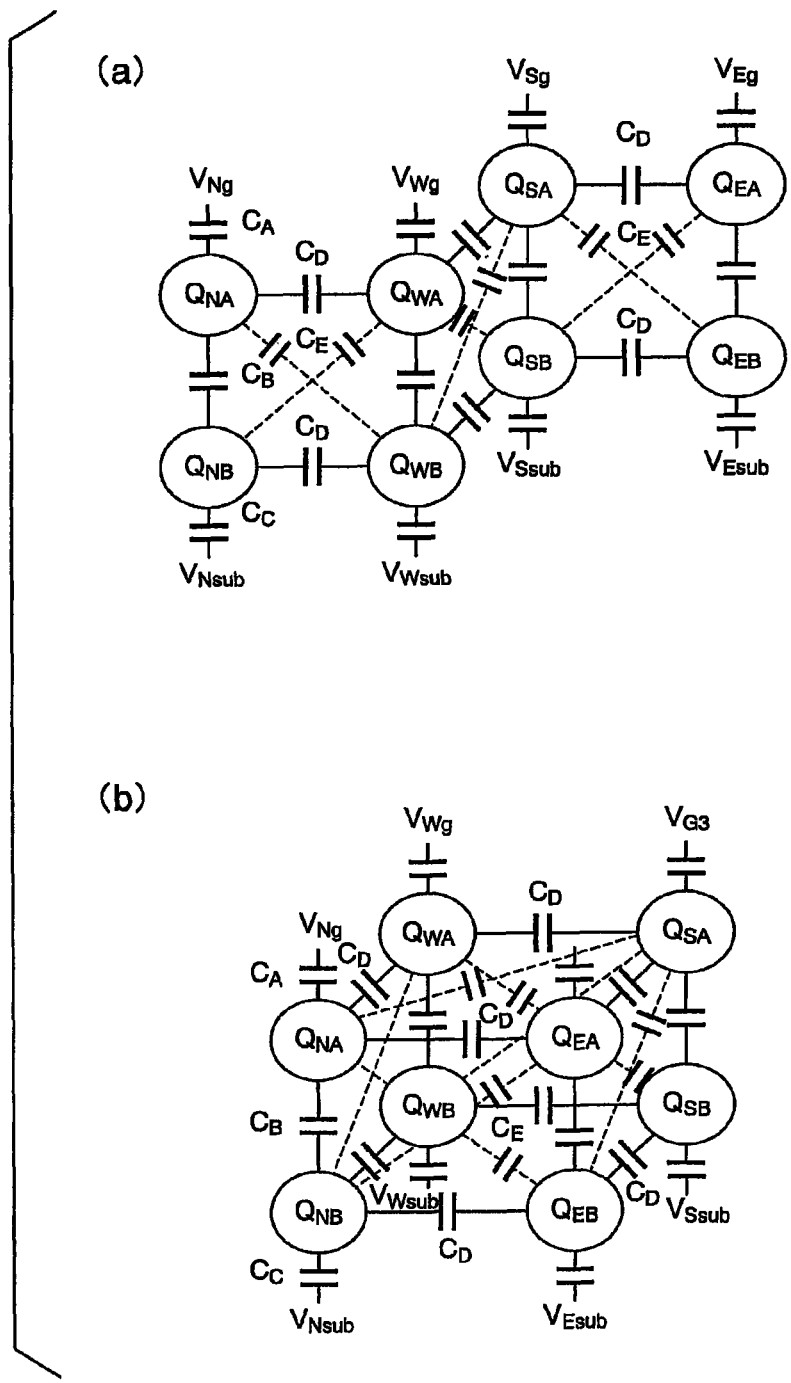
FIGS. 8(a) and 8(b) are diagrams showing point-symmetric and axisymmetric arrangement models used in respective simulations.
Figure 16:
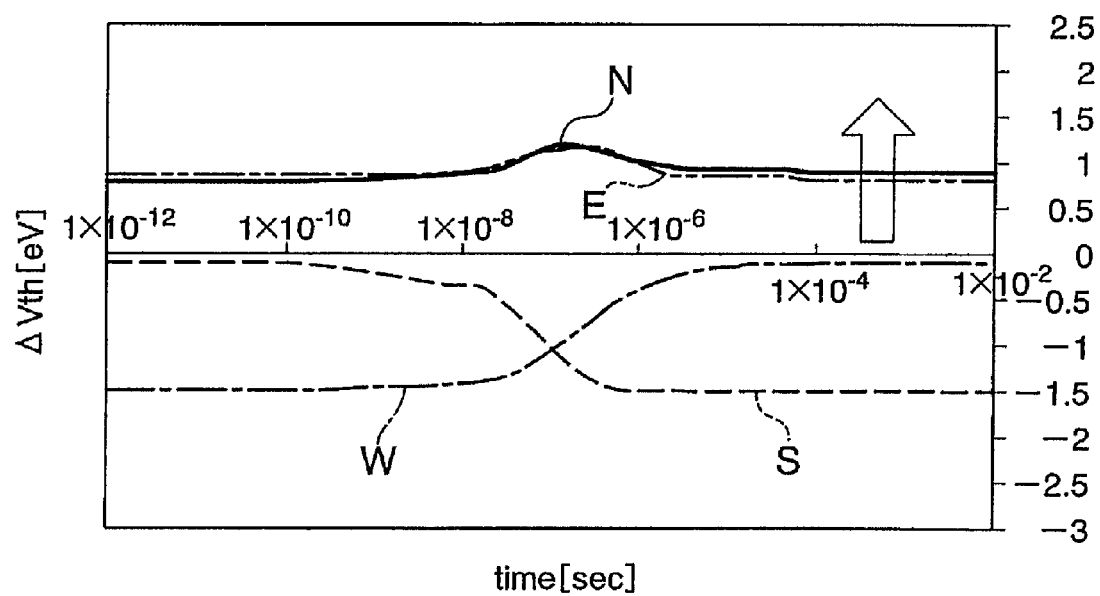
FIG. 16 illustrates an example case where threshold voltage shifts are disturbed in a point-symmetric arrangement.
Figure 17:
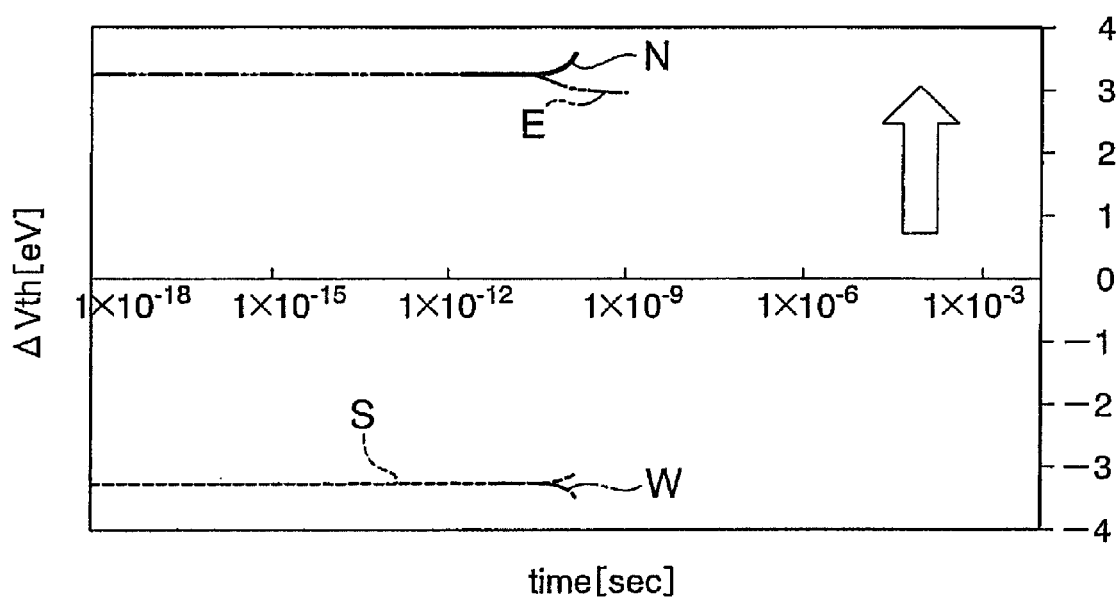
FIG. 17 illustrates an example case where threshold voltage shifts are disturbed in an axisymmetric arrangement.

Also, by using double floating gate structures, the EOT (Equivalent Oxide Thickness) becomes greater than that of a single transistor. According to the above described calculation, the EOT is equivalent to a gate insulating film of 3.2 nm (1 nm+1 nm+1.2 nm). To reduce the EOT and perform a faster switching operation, a so-called high-k material with a lower tunnel barrier than that of $SiO_2$ can be used for insulating films in double floating gate structures. If a high-k material is used between memory cells, the capacitance between the memory cells increases, and more charges are stored between the memory cells. As a result, the switching operation becomes slower. Therefore, a high-k material is preferably used for the insulating film between the first and second floating gate.

Where double floating gate structures are used, the essential point is the interference effect between the double floating gate structures. In this embodiment, the interference effect between double floating gate structures is in the form of the capacitance between floating gates, as shown in FIG. 8. If the interference effect is not achieved, the variations shown in FIGS. 11, 12(a), 12(b), 14, 15(a), and 15(b) would not be observed. Specifically, due to the hexagonal portions indicated by the dashed lines in FIGS. 9(a) and 9(b) or due to the existence of the N and S transistors on the left side in the case of the data "1" and the existence of the W and E transistors in the case of the data "0", the correlation between the remaining two cells having threshold voltage variations is lost. As there is interference between cells, positive charges and negative charges are well-balanced, and the entire SRAM is stabilized. Although interference between cells is an undesirable phenomenon in conventional NAND flash memories, interference between double floating gate structure cells is essential in effectively widening the noise margin of a SRAM, as disclosed by T. Tanamoto and K. Muraoka in Appl. Phys. Lett. 96, 022105 (2010).

Where the height of each floating gate is large or where cells are located too close to each other, the interaction between floating gates in the horizontal directions becomes stronger than the bond between the floating gates in the vertical direction in each one cell. In that case, the noise resistance of the SRAM becomes lower, and the threshold voltage shifts are disturbed. FIG. 16 shows an example case where the threshold voltage shifts are disturbed in the point-symmetric arrangement. FIG. 17 shows an example case where the threshold voltage shifts are disturbed in the axisymmetric arrangement. Specifically, the relationships between operations and the ratio of the capacitance $C_B$ between the vertical-direction floating gates in a cell to the capacitance $C_D$ between the floating gates between different cells were examined. Where the ratio is defined as $\alpha = C_D/C_B$, the ratio needs to be kept substantially within the following range:

$$\alpha < 0.1 \quad (5)$$

Where $d_D$ represents the distance between the two floating gates in a cell, and $d_B$ represents the distance between two floating gates of two cells, $C_D$ is proportional to $1/d_D$, and $C_B \propto$ is proportional to $1/d_B$. Accordingly, the relationship (5) means:

$$d_B < 0.1 \times d_D$$

Since the tunneling probability of electrons between floating gates is expressed by an exponent function of the thickness between the floating gates, the relationship (5) can also be expressed with tunneling probabilities:

$$\exp(-10 d_B) = [\exp(-d_B)]^{10} > \exp(-d_D)$$

In other words, the relationship (5) compensates for the fact that the tunneling probability of electrons between cells is ten or more times lower than the tunneling probability within a cell.

As described so far, according to this embodiment, by using double floating gate structures including silicon oxide films or high-permittivity films, dipole moments can be artificially generated to control the threshold voltage, and the noise characteristics of a SRAM can be improved. All the double floating gate structures used in this embodiment can be formed with materials that are used in CMOS manufacturing processes. Accordingly, no major changes in the manufacturing apparatus are required, and artificial-dipole SRAMs with a high degree of freedom in design can be provided.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A memory, comprising:
at least one SRAM cell including:
a first inverter including a first P-channel transistor and a first N-channel transistor;
a second inverter including a second P-channel transistor and a second N-channel transistor, the second inverter being cross-coupled to the first inverter;
a third N-channel transistor including a source/drain and a gate, one of the source/drain of the third N-channel transistor being connected to an output node of the first inverter, the other one of the source/drain being connected to a first interconnect, the gate of the third N-channel transistor being connected to a second interconnect; and
a fourth N-channel transistor including a source/drain and a gate, one of the source/drain of the fourth N-channel transistor being connected to an output node of the second inverter, the other one of the source/drain being connected to a third interconnect, the gate of the fourth N-channel transistor being connected to the second interconnect,
each of the first and second P-channel transistors being formed on a first semiconductor region and including:
a first insulating film formed on the first semiconductor region;
a first floating gate formed on the first insulating film;
a second insulating film formed on the first floating gate;
a second floating gate formed on the second insulating film;
a third insulating film formed on the second floating gate; and
a first control gate formed on the third insulating film,
each of the first and second N-channel transistors being formed on a second semiconductor region and including:
a fourth insulating film formed on the second semiconductor region;
a third floating gate formed on the fourth insulating film;
a fifth insulating film formed on the third floating gate;
a fourth floating gate formed on the fifth insulating film;
a sixth insulating film formed on the fourth floating gate; and
a second control gate formed on the sixth insulating film, and
each of the third and fourth N-channel transistors being formed on the second semiconductor region and including:
a seventh insulating film formed on the second semiconductor region;
a fifth floating gate formed on the seventh insulating film;
an eighth insulating film formed on the fifth floating gate;
a sixth floating gate formed on the eighth insulating film;
a ninth insulating film formed on the sixth floating gate; and
a third control gate formed on the ninth insulating film.

2. The memory according to claim 1, wherein the first and second P-channel transistors have a substrate bias set to a first potential, and the first and second N-channel transistors have a substrate bias set to a second potential, the second potential being higher than the first potential.

3. The memory according to claim 1, wherein the first P-channel transistor and the first N-channel transistor are arranged symmetrically about a center point of the SRAM cell, and the second P-channel transistor and the second N-channel transistor are arranged symmetrically about the center point of the SRAM cell.

4. The memory according to claim 1, wherein the first P-channel transistor and the first N-channel transistor are arranged symmetrically about a center line of the SRAM cell, and the second P-channel transistor and the second N-channel transistor are arranged symmetrically about the center line of the SRAM cell.

5. The memory according to claim 1, wherein each of the first and second insulating films and the fourth and fifth insulating films includes one of a silicon oxide layer and a high-permittivity layer.

6. The memory according to claim 1, wherein, among respective transistors forming the SRAM cell,
 a capacitance between two floating gates of two different cells is smaller than 0.1 times a capacitance between the upper floating gate and the lower floating gate of a cell.

7. The memory according to claim 6, wherein a floating gate of the first transistor is electrostatically coupled to a floating gate of the second transistor, and a charge state of the floating gate of one of the first and second transistors varies with a charge state of the floating gate of the other one of the first and second transistors.

\* \* \* \* \*